(12) United States Patent
McKay, Jr. et al.

(10) Patent No.: US 9,695,515 B2
(45) Date of Patent: Jul. 4, 2017

(54) SUBSTRATE ETCH

(71) Applicant: HEWLETT-PACKARD DEVELOPMENT COMPANY, L.P., Houston, TX (US)

(72) Inventors: Roger A. McKay, Jr., Corvallis, OR (US); Patrick Sadik, Corvallis, OR (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 0 days.

(21) Appl. No.: 14/913,771

(22) PCT Filed: Aug. 30, 2013

(86) PCT No.: PCT/US2013/057604
§ 371 (c)(1),
(2) Date: Feb. 23, 2016

(87) PCT Pub. No.: WO2015/030802
PCT Pub. Date: Mar. 5, 2015

(65) Prior Publication Data
US 2016/0208394 A1    Jul. 21, 2016

(51) Int. Cl.
*C23F 1/16*       (2006.01)
*B41J 2/16*       (2006.01)
*B81C 1/00*       (2006.01)

(52) U.S. Cl.
CPC ............... *C23F 1/16* (2013.01); *B41J 2/1609* (2013.01); *B41J 2/1629* (2013.01); *B41J 2/1631* (2013.01); *B81C 1/00119* (2013.01); *B81B 2201/052* (2013.01)

(58) Field of Classification Search
None
See application file for complete search history.

(56) References Cited

U.S. PATENT DOCUMENTS

| | | | | |
|---|---|---|---|---|
| 3,830,665 A | * | 8/1974 | Roman | H01L 21/00 |
| | | | | 148/DIG. 51 |
| 6,149,190 A | * | 11/2000 | Galvin | B81C 1/00619 |
| | | | | 280/735 |
| 6,170,332 B1 | * | 1/2001 | MacDonald | B81C 1/00619 |
| | | | | 73/514.32 |
| 6,607,934 B2 | * | 8/2003 | Chang | B81C 1/00246 |
| | | | | 438/119 |
| 7,075,160 B2 | * | 7/2006 | Partridge | B81C 1/00333 |
| | | | | 257/414 |
| 7,719,752 B2 | * | 5/2010 | Sampsell | G02B 5/284 |
| | | | | 359/290 |
| 7,980,828 B1 | * | 7/2011 | Lantz | F04B 19/006 |
| | | | | 417/207 |

(Continued)

FOREIGN PATENT DOCUMENTS

| WO | WO-2011049804 A3 | 4/2011 |
|---|---|---|
| WO | WO-2013093504 A3 | 6/2014 |

*Primary Examiner* — Allan Olsen
(74) *Attorney, Agent, or Firm* — HP Inc.—Patent Department

(57) ABSTRACT

An example provides a method including providing a substrate including an area having a plurality of pores and etching the area of the substrate to remove the plurality of pores to form a recess in the substrate. In some examples, the recess may form, at least in part, a device.

17 Claims, 5 Drawing Sheets

(56) References Cited

U.S. PATENT DOCUMENTS

| | | | |
|---|---|---|---|
| 8,181,522 B2* | 5/2012 | Scheuerer | G01P 15/125 |
| | | | 73/514.18 |
| 8,188,557 B2* | 5/2012 | Rombach | H04R 31/00 |
| | | | 257/416 |
| 8,193,095 B2 | 6/2012 | Lin | |
| 8,278,191 B2 | 10/2012 | Hildreth | |
| 8,871,551 B2* | 10/2014 | Partridge | B81B 7/007 |
| | | | 438/456 |
| 9,128,114 B2* | 9/2015 | Langereis | G01P 15/0802 |
| 9,157,927 B2* | 10/2015 | Kanemoto | G01P 15/0802 |
| 2002/0096489 A1* | 7/2002 | Lee | B41J 2/14137 |
| | | | 216/27 |
| 2007/0273263 A1* | 11/2007 | Hudspeth | H01J 1/304 |
| | | | 313/309 |
| 2009/0050487 A1 | 2/2009 | Fang | |
| 2009/0050988 A1* | 2/2009 | Suzuki | B81C 1/00269 |
| | | | 257/415 |
| 2009/0169035 A1* | 7/2009 | Rombach | H04R 19/005 |
| | | | 381/175 |
| 2011/0146774 A1 | 6/2011 | Kim | |
| 2011/0310182 A1* | 12/2011 | Mardilovich | B41J 2/14129 |
| | | | 347/56 |
| 2014/0170774 A1* | 6/2014 | Mao | H01L 29/66969 |
| | | | 438/3 |

* cited by examiner

SUBSTRATE ETCH

BACKGROUND

A number of devices may be implemented with recesses or voids (such as, e.g., a chamber or channel) in a substrate. Micro-electrical-mechanical systems (MEMS) devices, for example, may include air chambers to house components and/or to provide functionality to the devices. Printheads, which sometimes may be MEMS-based, may include firing chambers, ink feed slots, or ink channels.

BRIEF DESCRIPTION OF THE DRAWINGS

The detailed description section references the drawings, wherein.

all in which various examples may be implemented.

Certain examples are shown in the above-identified figures and described in detail below. The figures are not necessarily to scale, and various features and views of the figures may be shown exaggerated in scale or in schematic for clarity and/or conciseness.

DETAILED DESCRIPTION OF EMBODIMENTS

Many devices are fabricated to include recesses or other openings (e.g., chambers, channels, voids, etc.). Micro-electrical-mechanical systems (MEMS) devices, for example, may include chambers to house components and/or to provide functionality to the devices. Printheads may include firing chambers, ink feed slots, or ink channels, and sometimes may be fabricated using MEMS technology. In some cases, recesses or voids may be formed in a layer and the layer may be bonded with at least one other layer to form a device.

Bulk micromachining of substrates may be performed using dry or wet etching processes. Bulk dry etch processes, however, may be lengthy as these processes are commonly performed on a one-wafer-run basis. In some wet etch operations, trenches with sloped, rather than vertical, sidewalls may be formed.

Described herein are implementations of methods for etching a substrate. In some examples, a method for etching a substrate may include providing a substrate including an area having a plurality of pores and etching the area of the substrate to remove the plurality of pores to form a recess in the substrate. In various implementations, etching a substrate including a plurality of pores may facilitate bulk etching of the substrate when fabricating a device, such as, for example, a MEMS device, a printhead, or another device, using the substrate.

Figure 1:
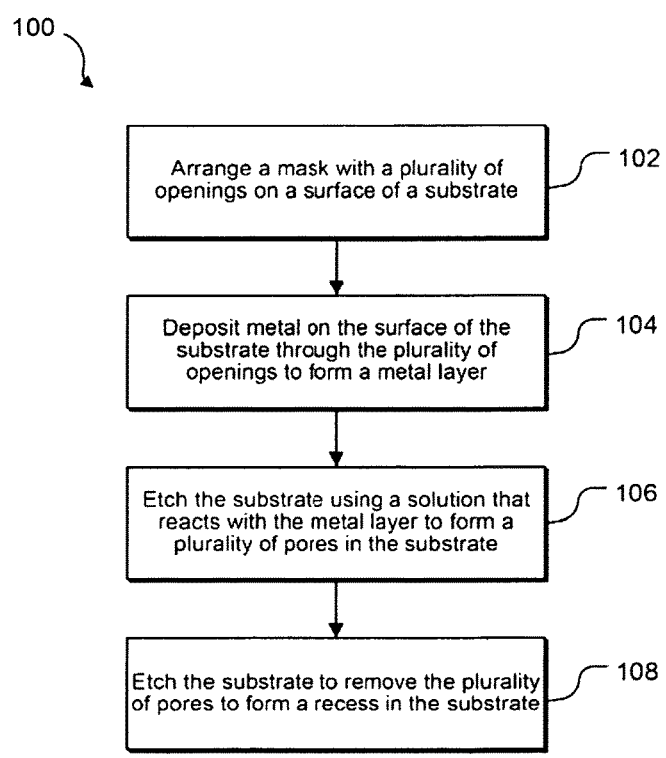
FIG. 1 is a flow diagram of an example method for etching a substrate.

An example method 100 for etching a substrate is illustrated in FIG. 1. Processing for the method 100 may begin or proceed with arranging a mask with a plurality of openings on a surface of a substrate, at block 102. The substrate may comprise one layer or multiple layers. For example, the substrate may comprise at least one layer of silicon, silicon germanium, a nitride, an oxide, a polymer, a ceramic, a metal, a group III-V material, a combination thereof, etc. In at least some implementations, the substrate may comprise silicon or silicon with at least one other layer thereon. In various implementations, the substrate may comprise any material suitable for forming a device, such as, for example, a MEMS device, a printhead, or another device. Various other substrate materials may be possible within the scope of the present disclosure.

It is noted that although various drawings referenced herein may depict the substrate as a single unitary layer, it should be understood that the substrate may in fact comprise multiple substrate layers and that any reference to a surface of the substrate may mean a surface of a substrate that comprises multiple layers. In some implementations, the substrate may comprise multiple substrates bonded together, and the multiple substrates may comprise the same crystal orientations or different crystal orientations.

The mask with the plurality of openings may comprise any material suitable for providing a patterning template for forming metal on the substrate (as described below). In various implementations, the mask may comprise a hard mask. A hard mask may comprise, without limitation, silicon carbide, silicon nitride, tetraethyl orthosilicate (TEOS), or another suitable hard mask material. In other implementations, the mask may comprise a photoresist material. In various implementations, the mask may comprise one layer or may instead comprise multiple same or different layers. For example, the mask may comprise a hard mask material on an oxide layer. Various other implementations may be possible within the scope of the present disclosure.

The method 100 may proceed to block 104 by depositing metal on the surface of the substrate through the plurality of openings in the mask to form a metal layer. As noted above, the mask may provide a patterning template for forming the metal on the substrate at locations corresponding to the locations of the plurality of openings in the mask. As such, the metal layer may be discontinuous.

The metal may comprise any metal that reacts with the solutions described herein to etch the substrate via metal-assisted chemical etching. For example, in various implementations, the metal may comprise a metal catalyst that reacts with a solution of hydrofluoric acid with hydrogen peroxide or nitric acid, or both, to etch the substrate. Examples of suitable metals may include, but are not limited to, gold, silver, platinum, ruthenium, platinum, palladium, molybdenum, chromium, copper, tantalum, titanium, tungsten, and alloys thereof.

The method 100 may proceed to block 106 by etching the substrate using the solution that reacts with the metal layer to form a plurality of pores in the substrate. In various implementations, the solution may comprise hydrogen peroxide and/or nitric acid with hydrofluoric acid and water, and the etching operation may comprise a metal-assisted chemical etch process in which the metal is a catalyst, and the substrate surface acts as an anode and the metal acts as the cathode. The metal may catalyze the reduction of hydrogen peroxide or nitric acid, which may result in a flow of electrons from the anode to the cathode and the "sinking" of the metal into the substrate to anisotropically etch the substrate. In various implementations, an etch rate using the solution and the metal catalyst may be 5 µm per minute or greater. In various implementations, nitric acid added to a solution of hydrogen peroxide, hydrofluoric acid, and water may add isotrophy to the etch to dissolve the porous substrate as it is created. In some of these implementations, the amount of the nitric acid may control, at least in part, lateral etching of areas near the surface of the substrate while the ratio of the nitric acid to the hydrogen peroxide may control, at least in part, the sidewall profile.

Etching of the substrate by the solution may be performed at ambient temperature or another suitable temperature. Increasing temperature may, in some cases, increase or otherwise impact the etch rate. In some implementations, the etching of the substrate by the solution may be performed under agitation or in a still bath. The solution may be formulated by any concentration to provide a particular etch rate. Likewise, the ratio of hydrogen peroxide to hydrofluoric acid to water or nitric acid to hydrofluoric acid to water may depend on the particular etch rate, and may vary during the etch operation. In various implementations, the etching may be performed under illumination with UV or optical wavelengths, which may increase or other increase efficiency of the etch.

In various implementations, the mask may be removed after depositing the metal on the surface of the substrate at block 104, and either before or after etching the substrate using the solution at block 106.

After etching the substrate at block 106 and after removing the mask, the method 100 may then proceed to block 108 by etching the substrate to remove the plurality of pores to form a recess in the substrate. In various implementations, forming the recess in the substrate including the plurality of pores may allow the etch to proceed at a faster rate as compared to etching a substrate without pores. The substrate may be etched to remove the plurality of pores using a wet etch with an etchant such as, but not limited to, tetra-methyl ammonium hydroxide or potassium hydroxide. In other implementations, the substrate may be etched to remove the plurality of pores using a dry etch.

The recess may comprise any opening in the substrate. For example, the recess may comprise a trench, a blind hole, a through-hole, etc. In various implementations, multiple recesses may be formed in the substrate at different locations of the substrate. In various implementations, the recess(es) may form, at least in part, a MEMS device, a printhead device, or another device. In various implementations, a recess may have a width of at least 1 µm. In some of these implementations, the recess may have a width in a range of about 10 µm to about 20 µm. In various implementations, the recess may have a width greater than 20 µm. For example, in some implementations, the recess may have a width greater than 500 µm.

Understanding of the various methods for etching a substrate as described herein may be facilitated with reference to FIGS. 2-13, which describe various operations for etching a substrate by way of sectional views of the substrate at various stages of the methods. It should be noted that various operations discussed and/or illustrated may be generally referred to as multiple discrete operations in turn to help in understanding various implementations. The order of description should not be construed to imply that these operations are order dependent, unless explicitly stated. Moreover, some implementations may include more or fewer operations than may be described.

Figure 2:
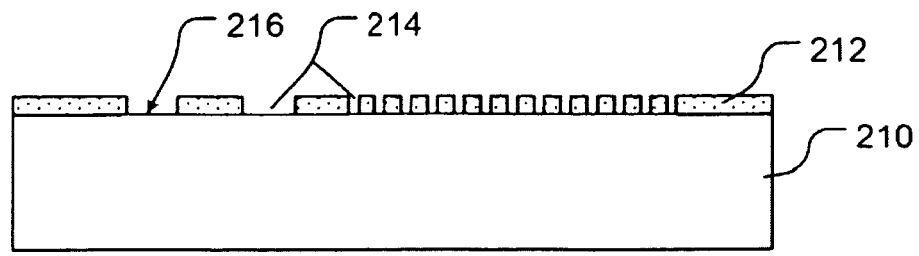
FIGS. 2-8 illustrate sectional views of a substrate at various stages of an example method for etching the substrate.

Turning now to FIG. 2, a method for etching a substrate 210, in accordance with various implementations, may begin or proceed with providing a substrate 210 and arranging a mask 212 with a plurality of openings 214 on a surface 216 of the substrate 210. In various implementations, the plurality of openings 214 may be formed in the mask 212 prior to arranging on the substrate 210. In other implementations, a material with which the mask 212 is to be formed may be formed on the substrate 210 and then the plurality of openings 214 may be patterned to form the mask 212.

Figure 3:
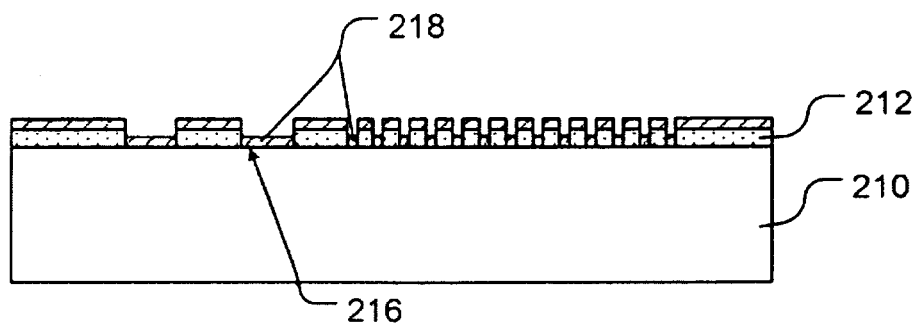

A metal may be deposited onto the surface 216 of the substrate 210 through the plurality of openings 214 in the mask 212 to form a metal layer 218, as shown in FIG. 3. In various implementations and as shown, the metal layer 218 may be blanket deposited over the mask 212 such that portions of the metal layer 218 are on the surface 216 of the substrate 210 and other portions of the metal layer 218 are on the mask 212, as shown. In other implementations, the metal layer 218 may be formed on the surface 216 of the substrate 210 without using the mask 212. For example, a patterned metal layer 218 may be laminated onto the surface 216 of the substrate 210 or a continuous metal layer may be formed on the surface 216 of the substrate 210 and then patterned to form a discontinuous metal layer 218.

Figure 4:
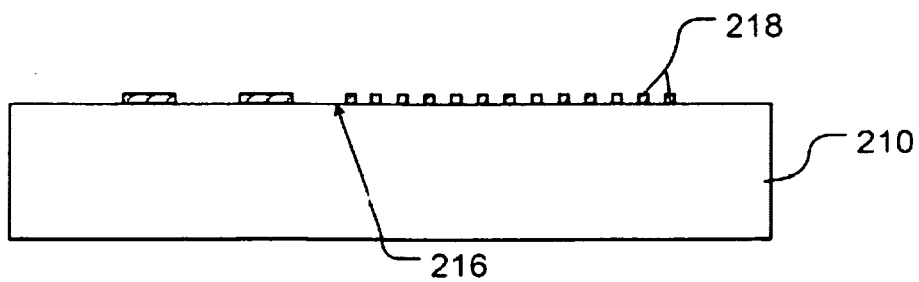
Figure 5:
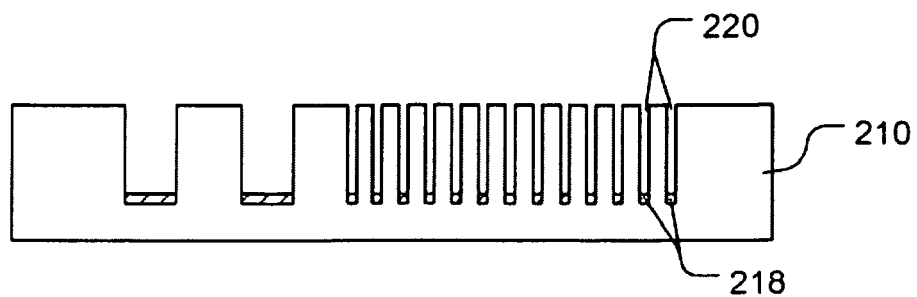

In various implementations, the mask 212 may be removed after forming the metal layer 218, as shown in FIG. 4, and then the substrate 210 may be etched using a solution that reacts with the metal layer 218 to form a plurality of pores 220 in the substrate 210, as shown in FIG. 5.

Figure 6:
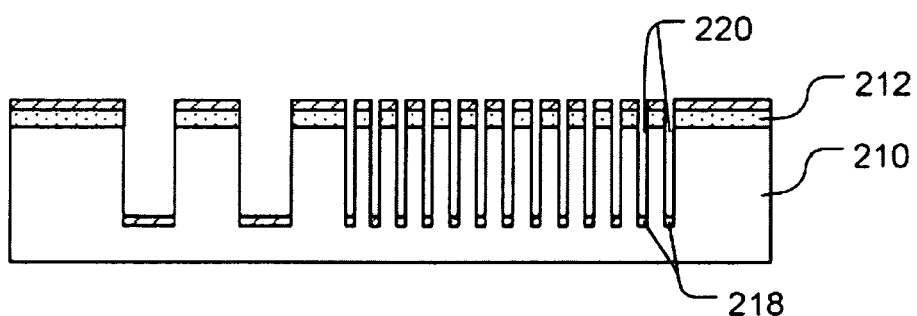

In various implementations, the mask 212 may remain on the substrate 210 during etching of the pores 220, as shown in FIG. 6, and removed thereafter.

Figure 7:
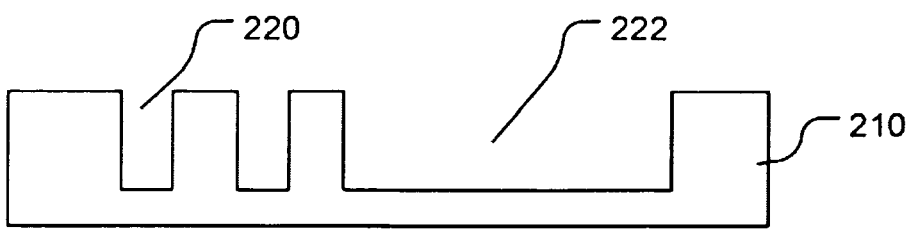

After etching the substrate 210 to form the plurality of pores 220, the substrate 210 may be etched to remove at least some of the plurality of pores 220 to form at least one recess 222 in the substrate 210, as shown in FIG. 7. In various implementations, all or fewer than all of the plurality of pores 220 may be etched. As shown, for example, some of the pores 220 may not be etched while other pores 220 are etched to form the recess 222.

Figure 8:
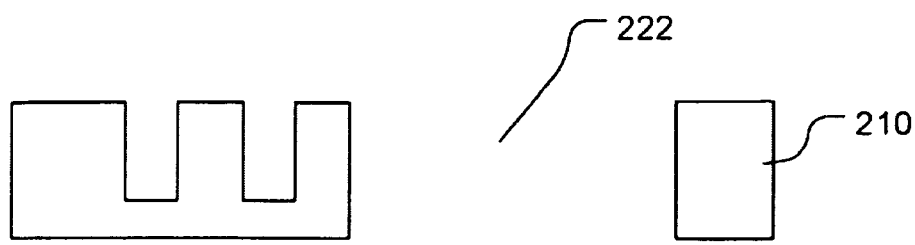

The recess 222 shown in FIG. 7 may be a trench or a blind hole in the substrate 210 or the recess 222 may be formed through an entire thickness of the substrate 210 to form a through-hole, as shown in FIG. 8. The substrate 210 including the recess 222 may form, at least in part, a MEMS device, a printhead, or another device. In various ones of these implementations, a printhead may be formed with the MEMS device.

Figure 9:
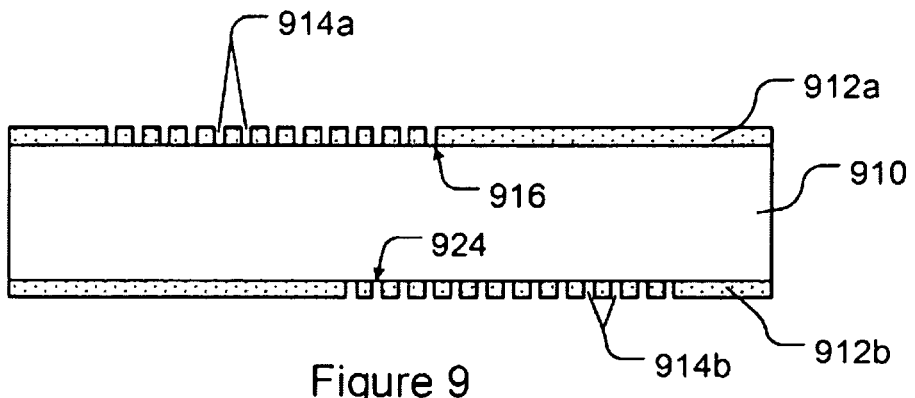
FIGS. 9-13 illustrate sectional views of a substrate at various stages of another example method for etching the substrate.

In various implementations, a substrate may be etched on opposite surfaces for forming a device. As shown in FIG. 9, a method for etching a substrate may include providing a substrate 910 and arranging a mask 912a on a first surface 916 of the substrate 910, and another mask 912b may be arranged on a second surface 924, opposite the first surface 916, of the substrate 910. In various implementations, a substrate may comprise a cubic, block, 3D-type substrates with orthogonal or non-orthogonal surface planes, or the like. In at least some of these implementations, the substrate may be etched on multiple surfaces.

The masks 912a, 912b may each include a plurality of openings 914a, 914b. In various implementations, the plurality of openings 914a, 914b may be formed in the masks 912a, 912b prior to arranging on the substrate 910. In other implementations, a material with which the masks 912a, 912b are to be formed may be formed on the substrate 910 and then the plurality of openings 914a, 914b may be patterned to form the masks 912a, 912b.

Figure 10:
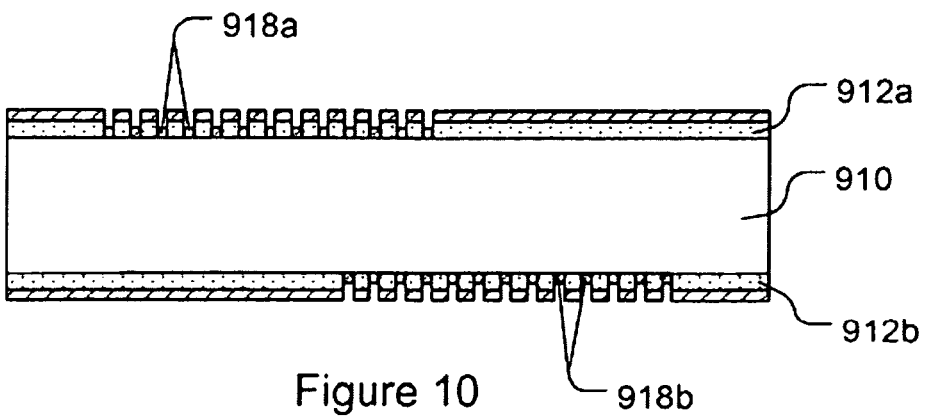

A metal may be deposited onto the first surface 916 of the substrate 910 and on the second surface 924 of the substrate 910 through the plurality of openings 914a, 914b in the masks 912a, 912b to form metal layers 918a, 918b, as shown in FIG. 10. In various implementations and as shown, the metal layers 918a, 918b may be blanket deposited over the masks 912a, 912b such that portions of the metal layers 918a, 918b are on the surfaces of the substrate 910 and other portions of the metal layers 918a. 918b are on the mask 912a. 912b, as shown. In other implementations, the metal layers 918a, 918b may be formed on the surfaces of the substrate 910 without using the masks 912a, 912b. For example, patterned metal layers 918a, 918b may be laminated onto the surfaces of the substrate 910 or a continuous metal layer may be formed on the surface of the substrate 910 and then patterned to form discontinuous metal layers 918a. 918b.

Figure 11:
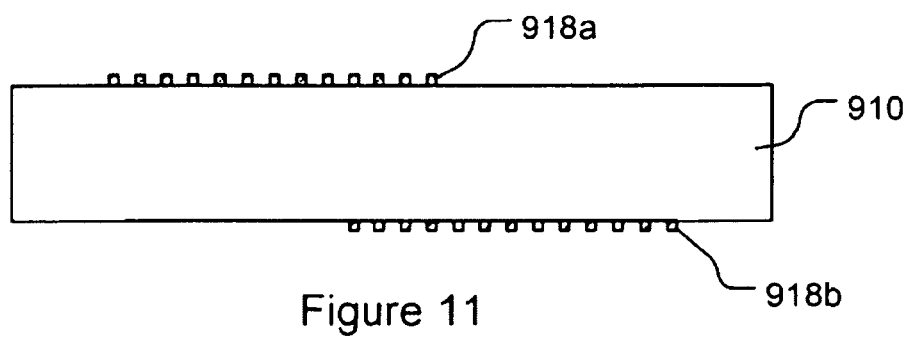
Figure 12:
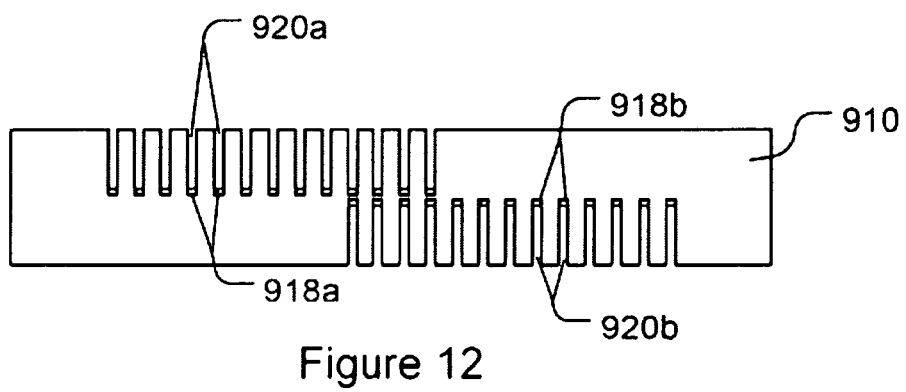

In various implementations, the masks 912a, 912b may be removed after forming the metal layers 918a, 918b, as shown in FIG. 11, and then the substrate 910 may be etched using a solution that reacts with the metal layers 918a, 918b to form a plurality of pores 920a, 920b in each surface of the substrate 910, as shown in FIG. 12. Although not shown here, in various implementations, the masks 912a. 912b may be removed after etching the substrate 910 using the solution that reacts with the metal layers 918a, 918b to form the plurality of pores 920a, 920b in the substrate 910.

Figure 13:
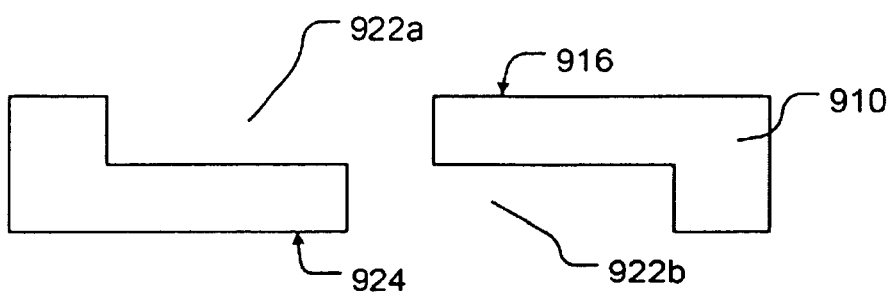

After etching the substrate 910 to form the plurality of pores 920a, 920b, the substrate 910 may be etched to remove at least some of the plurality of pores 920 to form at least one recess 922a, 922b in each surface of the substrate 910, as shown in FIG. 13. In various implementations, all or fewer than all of the plurality of pores 220 may be etched. As shown, for example, some of the pores 920a, 920b may not be etched while other pores 920a, 920b are etched to form the recesses 922a, 922b.

As shown, at least one of the recesses 922a in the first surface 916 of the substrate 910 may interconnect with at least one of the recesses 922b in the second surface 924 of the substrate 910, as shown in FIG. 13. Other ones of the recesses 922a, 922b may comprise a trench, a blind hole, another opening, or a combination thereof. The substrate 910 including the recesses 922a, 922b may form, at least in part, a MEMS device, a printhead, or another device. In various ones of these implementations, a printhead may be formed with the MEMS device.

By patterning the substrate 910 on both surfaces 916, 924, more complex devices may be formed or may be formed with fewer separate operations than by patterning the substrate 910 on only one surface. As noted elsewhere, the substrate 910 may comprise multiple substrate layers such as, for example, a silicon substrate bonded to another silicon substrate. The substrate layers may comprise substrates of the same or different crystal orientation. For example, the substrate 910 may comprise two <100>, <110>, or <111> substrates bonded together, and the substrates may be arranged so the crystal orientations align or are offset. In some implementations, the substrate 910 may comprise substrates of different crystal orientations. For example, the substrate 910 may comprise a <100> substrate bonded with a <110> substrate, or some other combination of crystal orientations.

Various aspects of the illustrative embodiments are described herein using terms commonly employed by those skilled in the art to convey the substance of their work to others skilled in the art. It will be apparent to those skilled in the art that alternate embodiments may be practiced with only some of the described aspects. For purposes of explanation, specific numbers, materials, and configurations are set forth in order to provide a thorough understanding of the illustrative embodiments. It will be apparent to one skilled in the art that alternate embodiments may be practiced without the specific details. In other instances, well-known features are omitted or simplified in order not to obscure the illustrative embodiments.

Flow diagrams are provided to describe various methods for etching a substrate, in accordance with various implementations. While the flow diagrams illustrate various operations in a particular order, the drawings are not intended to limit the present disclosure to any particular order. Additionally, the drawings are not intended to imply that all operations are required for all implementations.

The phrases "in an example,' "in various examples," "in some examples," "in various embodiments," and "in some embodiments" are used repeatedly. The phrases generally do not refer to the same embodiments; however, they may. The terms "comprising." "having," and "including" are synonymous, unless the context dictates otherwise. The phrase "A and/or B" means (A), (B), or (A and B). The phrase "A/B" means (A), (B), or (A and B), similar to the phrase "A and/or B". The phrase "at least one of A, B, and C" means (A), (B), (C), (A and B), (A and C), (B and C), or (A, B and C). The phrase "(A) B" means (B) or (A and B), that is, A is optional. Usage of terms like "top", "bottom", and "side" are to assist in understanding, and they are not to be construed to be limiting on the disclosure.

Although certain embodiments have been illustrated and described herein, it will be appreciated by those of ordinary skill in the art that a wide variety of alternate and/or equivalent embodiments or implementations calculated to achieve the same purposes may be substituted for the embodiments shown and described without departing from the scope of this disclosure. Those with skill in the art will readily appreciate that embodiments may be implemented in a wide variety of ways. This application is intended to cover any adaptations or variations of the embodiments discussed herein. It is manifestly intended, therefore, that embodiments be limited only by the claims and the equivalents thereof.

What is claimed is:

1. A method comprising:
  arranging a mask with a plurality of openings on a surface of a substrate;
  depositing metal on the surface of the substrate through the plurality of openings to form a metal layer;
  arranging another mask with a plurality of openings on an opposite side of the substrate;
  depositing metal on the opposite side of the substrate through the mask on that opposite side of the substrate prior to etching the substrate;
  etching the substrate using a solution that reacts with the metal layer to form a plurality of pores in the substrate; and
  etching the substrate to remove the plurality of pores to form a recess in the substrate.

2. The method of claim 1, wherein the metal layer is a discontinuous metal layer.

3. The method of claim 1, wherein the mask is a silicon carbide hard mask.

4. The method of claim 1, further comprising removing the mask after said depositing the metal.

5. The method of claim 4, wherein said removing is performed prior to said etching the substrate using the solution.

6. The method of claim 1, wherein the metal layer comprises a metal selected from a group consisting of gold silver, platinum, ruthenium, platinum, palladium, molybdenum, chromium, copper, tantalum, titanium, tungsten, and alloys thereof.

7. The method of claim 1, wherein the solution comprises hydrogen peroxide, hydrofluoric acid, and water.

8. The method of claim 1, wherein the recess comprises a trench, a blind hole, or a through-hole.

9. The method of claim 1, wherein the recess has a width greater than about 20 μm.

10. The method of claim 1, wherein the substrate comprises silicon.

11. The method of claim 1, wherein depositing metal through the plurality of openings of the mask further comprises blanket depositing metal over the mask.

12. The method of claim 1, wherein the mask comprises a photoresist material.

13. The method of claim 1, further comprising agitating a bath in which the substrate is etched.

14. The method of claim 1, further comprising illuminating the substrate during etching with ultraviolet or optical wavelengths that increase the efficiency of the etching.

15. The method of claim 1, further comprising controlling a sidewall profile of the etch in the substrate to form the plurality of pores in the substrate by controlling a ratio of nitric acid to hydrogen peroxide in the solution.

16. A method comprising:
   forming a metal layer on a surface of a substrate by depositing metal on a substrate through a plurality of openings of a mask;
   etching the substrate using a solution that reacts with the metal layer to form a plurality of pores in the surface in the substrate; and
   etching the substrate to remove the plurality of pores to form a micro-electrical-mechanical-systems (MEMS) device;
   wherein the surface is a first surface, and wherein the method further comprises:
   forming another metal layer on an area of a second surface, opposite the first surface, of the substrate by depositing metal on the substrate through a plurality of openings of another mask;
   etching the substrate using the solution to form another plurality of pores in the second surface in the substrate; and
   etching the substrate to remove the other plurality of pores to further form the MEMS device.

17. The method of claim 16, further comprising forming a printhead with the MEMS device.

* * * * *

UNITED STATES PATENT AND TRADEMARK OFFICE
CERTIFICATE OF CORRECTION

PATENT NO. : 9,695,515 B2
APPLICATION NO. : 14/913771
DATED : July 4, 2017
INVENTOR(S) : Roger A. McKay, Jr. et al.

Page 1 of 1

It is certified that error appears in the above-identified patent and that said Letters Patent is hereby corrected as shown below:

On the Title Page

In item (72), Inventors, in Column 1, Line 2, delete "Patrick Sadik" and insert -- Patrick Wayne Sadik --, therefor.

In the Claims

In Column 6, Line 60, in Claim 6, delete "gold" and insert -- gold, --, therefor.

Signed and Sealed this
Twentieth Day of March, 2018

Andrei Iancu
*Director of the United States Patent and Trademark Office*